United States Patent [19]

Maier

[11] Patent Number: 4,493,143
[45] Date of Patent: Jan. 15, 1985

[54] METHOD FOR MAKING A SEMICONDUCTOR DEVICE BY USING CAPILLARY ACTION TO TRANSPORT SOLDER BETWEEN DIFFERENT LAYERS TO BE SOLDERED

[75] Inventor: Herbert Maier, Heilbronn, Fed. Rep. of Germany

[73] Assignee: Telefunken Electronic GmbH, Heilbronn, Fed. Rep. of Germany

[21] Appl. No.: 315,296

[22] Filed: Oct. 23, 1981

[30] Foreign Application Priority Data

Oct. 30, 1980 [DE] Fed. Rep. of Germany ....... 3040867

[51] Int. Cl.³ ............................................. H01L 21/58
[52] U.S. Cl. ........................................ 29/590; 29/589; 174/52 H; 228/123; 228/258; 357/81
[58] Field of Search ...................... 29/588, 589, 590; 174/52 H; 228/246, 258, 123; 357/81

[56] References Cited

U.S. PATENT DOCUMENTS

| 3,434,018 | 3/1969 | Boczar et al. | 357/81 |
| 3,706,915 | 12/1972 | Lootens et al. | 29/589 X |
| 3,860,949 | 1/1975 | Stoeckert et al. | 29/589 X |
| 3,879,837 | 4/1975 | Mizukoshi et al. | 228/123 |
| 4,143,456 | 3/1979 | Inoue | 29/589 X |

FOREIGN PATENT DOCUMENTS 2238569 2/1973 Fed. Rep. of Germany .

Primary Examiner—Brian E. Hearn
Assistant Examiner—Alan E. Schiavelli
Attorney, Agent, or Firm—Spencer & Frank

[57] ABSTRACT

A semiconductor member is attached to a base by placing a wafer of solder material on the base, placing a carrier member having a through capillary hole on the solder wafer, placing the semiconductor member on the carrier member and heating the arrangement whereby the solder material melts to solder the carrier member to the base, the solder material also travelling via the capillary hole to solder the semiconductor member to the carrier member.

3 Claims, 2 Drawing Figures

METHOD FOR MAKING A SEMICONDUCTOR DEVICE BY USING CAPILLARY ACTION TO TRANSPORT SOLDER BETWEEN DIFFERENT LAYERS TO BE SOLDERED

BACKGROUND OF THE INVENTION

The invention relates to a semiconductor device and more particularly to a device comprising a casing support and a carrier member for a semiconductor member, the latter also being soldered onto the carrier member which is a good conductor of heat and is applied to the casing support with the aid of solder.

In order to achieve good dissipation of heat, particularly in power semiconductor components, a carrier member comprising a material which is a good conductor of heat has in the past been inserted between a metallic casing support and the semiconductor body. These carrier members comprise copper for example. In prior arrangement a soldered disc is placed onto the casing support, for example a TO-3 support. A copper disc for example, forming the carrier member is then placed onto the soldered disc. A second soldered disc is applied to the copper member. This arrangement is then placed in a solder furnace in which the solder melts at a relatively high soldering temperature and connects the carrier member to the casing support. After this soldering process, which takes place for example at 500° C., the surface of the carrier member which is now moistened by solder is brushed off and possibly subjected to further cleaning processes. The semiconductor member is then placed onto the upper surface of the carrier member which is coated with the solder and the arrangement is subjected to a second soldering process in which the semiconductor member is firmly connected to the carrier member. In order to avoid damage to the semiconductor member or the semiconductor component contained therein this second solder temperature is relatively low. For example if may be 400° C.

The method described has the disadvantage that two soldering processes are required, these being carrier out at different soldering temperatures and cleaning procedures have to be carried out between the soldering processes.

SUMMARY OF THE INVENTION

An object of the present invention is to provide a semiconductor arrangement which can be produced in fewer operations and with which greater manufacturing yield can be achieved. Another object of the present invention is to provide a suitable method of producing this semiconductor arrangement.

According to one aspect of the present invention there is provided a semiconductor device comprising a semiconductor member, a base and a carrier member for said semiconductor member, said semiconductor member being soldered to said carrier member and said carrier member being soldered to said base, said carrier member having at least one through capillary hole.

According to another aspect of the present invention there is provided a semiconductor arrangement comprising a semiconductor member, a casing support and a carrier member for said semiconductor member, said semiconductor member being soldered onto said carrier member, said carrier member being a good conductor of heat and being applied to the casing support with the aid of solder, the carrier member having at least one capillary opening, and a layer of solder material which is arranged between said casing support and said carrier member.

According to a further aspect of the present invention there is provided a method of manufacturing a semiconductor device comprising the steps of placing a solder wafer on a base member, placing a carrier member on said solder wafer, said carrier member having a through capillary hole, placing a semiconductor member on said carrier member, and applying heat, whereby said solder wafer melts and the melted solder material travels by means of said capillary hole to solder said semiconductor member to said carrier member.

According to a final aspect of the present invention there is provided a method of producing a semiconductor arrangement comprising the steps of placing a thin solder wafer onto a casing support, placing a carrier member with a capillary opening onto said solder wafer so that said capillary opening is covered on the underside of the carrier member by said soldered wafer placing a semiconductor member on said carrier member above said capillary opening, and connected said carrier member to said casing support in a soldering process whereby said semiconductor member is connected to said carrier member with the aid of solder which rises due to said capillary opening and which moistens the rear face of said semiconductor member.

BRIEF DESCRIPTION OF THE DRAWINGS

The invention will now be described in greater detail by way of example, with reference to the drawings, in which.

DESCRIPTION OF THE PREFERRED EMBODIMENT

In the construction of the casing support of the present invention, and in particular when forming the carrier member with a capillary opening, only one solder material is required between the casing support and the carrier member and only one soldering process is required. The molten solder arranged between the casing support and the carrier member rises through the capillary opening and moistens the rear face of the semiconductor member already arranged on the carrier member, so that the semiconductor member is firmly connected to the carrier member and the carrier member is firmly connected to the casing support in one soldering process. In particular a thin solder disc or wafer which is placed between the casing support and the carrier member is suitable as the soldering material for the semiconductor member. The carrier member comprises a material which is a good conductor of heat, more particularly a bright tinned, gold-plated or nickel-plated copper disc.

The solder wafer is preferably smaller than the carrier member in terms of area and the two members are arranged centrally one above another or the solder wafer is arranged centrally beneath the bore in the carrier member. As a result it is ensured that the capillary action of the opening provided in the carrier member is not destroyed by a capillary effect at the edge of the carrier or cooling member. For this reason the capillary opening is also preferably arranged centrally in the carrier member or so arranged that the opening lies centrally with respect to the semiconductor member arranged on the carrier member so that the solder rising through the opening is evenly distributed over the rear face of the semiconductor member which is preferably metalized.

The solder material preferably comprises a lead/tin alloy and a lead/tin alloy containing 40% tin has proved to be very suitable. The soldering process can be carried out at approximately 400° C. with the aid of this type of solder so that damage to the semiconductor member or to the components contained in the semiconductor member is safely avoided.

The construction of a semiconductor arrangement in accordance with the invention or the method for its manufacture is particularly advantageous in the case of power transistors, power rectifiers and high output circuits in which good heat dissipation has to be catered for.

Figure 1:
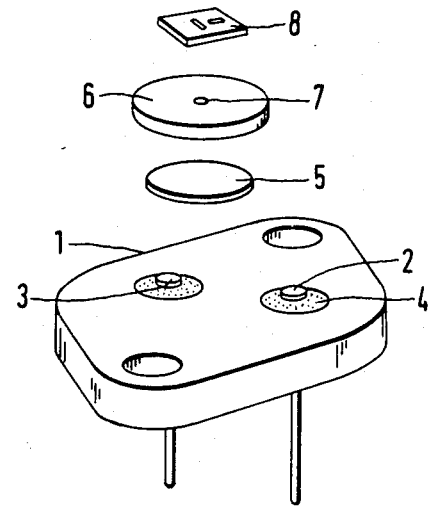
FIG. 1 shows the elements required for the semiconductor device and their arrangement with respect to each other in a perspective view.

Referring now to the drawings, a base or casing support for a power transistor is shown in FIG. 1. This casing support for example of the TO-3 type comprises a nickel-plated steel plate 1 having two insulated connecting wires 2 and 3. The insulating material substance surrounding the wires is designated 4. First of all a solder disc 5 is placed onto the casing support, said disc comprising a lead/tin alloy with a 40% tin concentration for example. Alternatively the solder may comprise a tin/indium alloy. This solder disc is 0.25 mm thick in a preferred arrangement and has a diameter of 7 mm. The cooling carrier member 6 for the semiconductor component is then placed onto the solder disc 5. This cooling member preferably comprises a bright, tinned or nickel-plated copper and in this case is 1 mm thick and has a diameter of 10 mm. The carrier member has a through opening 7 with a diameter of approximately 0.6 mm at its centre or near to its centre point. The opening cross-section has to be selected so that sufficient soldering material flows from the underside of the carrier member to the top face thereof as a result of the capillary action during the soldering process and so that sufficient soldering material moistens the rear face surface of the semiconductor member lying thereof. The capillary orifice 7 in the copper carrier plate 6 is preferably produced by stamping.

Finally the semiconductor member 8 with its rear face, which may be gold-plated for example, is placed onto the carrier member 6 with the central capillary bore 7. All of the parts are arranged centrally one above another so that the semiconductor member covers the capillary bore 7. The semiconductor member 8 is a power transistor for example, the collector region of which is contacted on its rear face, while the emitter and base regions have their connecting contacts on the front face of the semiconductor member.

Figure 2:
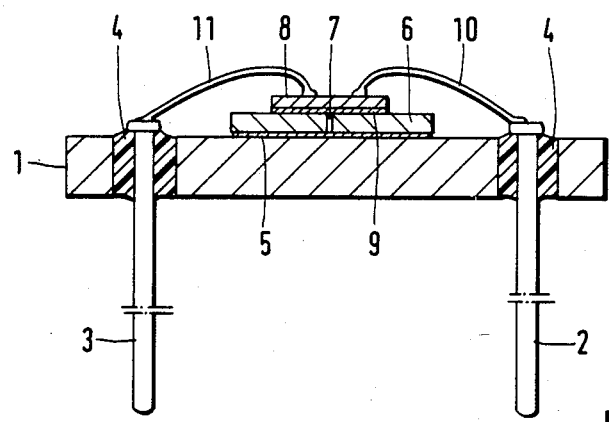
FIG. 2 shows a sectional view of the casing support with the semiconductor member arranged thereon.

FIG. 2 shows the finished semiconductor arrangement. At a soldering temperature of approximately 400° C. the solder disc 5 melts on the casing support 1 and the solder is transported from the underside of the carrier member 6 to the upper face by the capillary action of the opening 7 and there moistens the metalized rear or underside of the semiconductor member 8 to provide a solder layer 9. This metalization of the semiconductor member is the connecting contact of the collector in the arrangement shown. Since the solder disc 5 is smaller in cross-section than the carrier member 6, the solder does not rise at the edge of the carrier member, since this would in some circumstances reduce the capillary action of the orifice 7. As can be seen from FIG. 2 the emitter and the base contacts on the upper face of the semiconductor member 8 are electrically conductively connected to the insulated lead-in wires 2 and 3 of the support via thin contacting wires 10 and 11. Finally, a casing cap (not shown) is arranged on the casing support in order to complete the manufacturing process. The carrier member and the semiconductor member are preferably soldered in a hydrogen atmosphere.

It will be understood that the above description of the present invention is susceptible to various modifications changes and adaptations.

What is claimed is:

1. A method of producing a semiconductor arrangement comprising the steps of placing a thin solder wafer onto a casing support, placing a carrier member with a capillary opening onto said solder wafer so that said capillary opening is covered on the underside of the carrier member by said solder wafer, placing a semiconductor member on said carrier member above said capillary opening, and connecting said carrier member to said casing support and to said semiconductor member during a single soldering process wherein solder from said solder wafer rises due to said capillary opening and moistens the rear face of said semiconductor member.

2. A method as defined in claim 1 wherein the soldering process takes place at approximately 400° C.

3. A method of manufacturing a semiconductor device comprising the steps of placing a solder wafer on a base member, placing a carrier member on said solder wafer, said carrier member having a through capillary hole, placing a semiconductor member on said carrier member, and applying heat so that said solder wafer melts and the melted solder material solders said carrier member to said base member and travels by means of said capillary hole to solder said semiconductor member to said carrier member.

* * * * *